(12) United States Patent
Miura et al.

(10) Patent No.: US 12,205,989 B2
(45) Date of Patent: Jan. 21, 2025

(54) SILICON CARBIDE EPITAXIAL SUBSTRATE AND METHOD FOR MANUFACTURING SAME

(71) Applicant: PROTERIAL, LTD., Tokyo (JP)

(72) Inventors: Tsuyoshi Miura, Tokyo (JP); Hodaka Ichikawa, Tokyo (JP); Naoya Kimura, Tokyo (JP); Hiroyuki Okuda, Tokyo (JP); Taisuke Hirooka, Tokyo (JP)

(73) Assignee: PROTERIAL, LTD., Tokyo (JP)

( * ) Notice: Subject to any disclaimer, the term of this patent is extended or adjusted under 35 U.S.C. 154(b) by 292 days.

(21) Appl. No.: 17/686,463

(22) Filed: Mar. 4, 2022

(65) Prior Publication Data

US 2022/0310795 A1    Sep. 29, 2022

(30) Foreign Application Priority Data

Mar. 26, 2021 (JP) .................................. 2021-053223
Jan. 25, 2022 (JP) .................................. 2022-009513

(51) Int. Cl.
*H01L 29/16* (2006.01)
*C23C 16/32* (2006.01)
*C30B 25/20* (2006.01)
*C30B 29/36* (2006.01)
*H01L 21/02* (2006.01)

(52) U.S. Cl.
CPC ........ *H01L 29/1608* (2013.01); *C23C 16/325* (2013.01); *C30B 25/20* (2013.01); *C30B 29/36* (2013.01); *H01L 21/02378* (2013.01); *H01L 21/02433* (2013.01); *H01L 21/02529* (2013.01)

(58) Field of Classification Search
CPC .......... H01L 29/1608; H01L 21/02378; H01L 21/02529; C23C 16/325; C30B 25/20; C30B 29/36
See application file for complete search history.

(56) References Cited

U.S. PATENT DOCUMENTS 5,248,385 A * 9/1993 Powell .................. H01L 21/465
148/DIG. 148
7,531,433 B2 * 5/2009 Ellison .............. H01L 21/02529
117/951

(Continued)

FOREIGN PATENT DOCUMENTS

JP   2006-321707 A   11/2006
JP   2006-328455 A   12/2006

(Continued)

OTHER PUBLICATIONS

Wada et al., "Epitaxial growth of 4H—SiC on 4° off-axis (0001) and (000$\bar{1}$) substrates by hot-wall chemical vapor deposition", Journal of Crystal Growth, vol. 291, 2006, pp. 370-374.

(Continued)

*Primary Examiner* — Joanna Pleszczynska
(74) *Attorney, Agent, or Firm* — NIXON PEABODY LLP; Jeffrey L. Costellia

(57) ABSTRACT

A method for manufacturing a silicon carbide epitaxial substrate which has a first surface which is a (000-1) C-face, a silicon carbide epitaxial layer located on the first surface of the silicon carbide substrate, and a line-shaped surface defect density on a top surface of the silicon carbide epitaxial layer is less than 1.0 cm$^{-2}$ and a stacking fault density is less than 1.2 cm$^{-2}$.

11 Claims, 5 Drawing Sheets

(56) References Cited

U.S. PATENT DOCUMENTS

2009/0302326 A1   12/2009   Maruyama
2016/0218003 A1   7/2016    Hirooka et al.

FOREIGN PATENT DOCUMENTS

| JP | 4539140 | 9/2010 |
| JP | 2015-143168 A | 8/2015 |
| JP | 6295969 | 3/2018 |
| WO | WO-2015/114961 | 8/2015 |

OTHER PUBLICATIONS

Kojima et al., "Epitaxial Growth of High-Quality 4H-SiC Carbon-Face by Low-Pressure Hot-Wall Chemical Vapor Deposition", Jpn. J. Appl. Phys., vol. 42, 2003, pp. L637-L639.

Noboru Ohtani, " Status of development of low resistivity SiC single crystals for power device applications", vol. 45, No. 3, (2018), Jul. 31, 2018, pp. 1-8.

Shun-ichi Nakamura et al., "Homoepitaxial Growth on 4H-SiC {0001}-Vicinal Faces", J. Soc. Mat. Sci., Japan, vol. 53, No. 12, Dec. 2004, pp. 1323-1327.

Yuuki Ishida "Recent Developments in the High-Rate Growth of SiC Epitaxial Layers by the Chemical Vapor Deposition Method", J, Vac. Soc,. Japan, vol. 54, No. 6, 2011, pp. 346-352.

Japanese Notice of Reasons for Refusal for Application No. 2022-009513, mailed Apr. 23, 2024 (6 pages).

Notice of Reasons for Rejection in Japanese App. No. 2024-115561 mailed Oct. 1, 2024 (6 pages).

\* cited by examiner

SILICON CARBIDE EPITAXIAL SUBSTRATE AND METHOD FOR MANUFACTURING SAME

CROSS-REFERENCE TO RELATED APPLICATION

This application claims priority to Japanese Patent Application No. 2021-053223, filed on Mar. 26, 2021, and Japanese Application No. 2022-009513, filed on Jan. 25, 2022, the entire contents of which are hereby incorporated by reference.

BACKGROUND

The present disclosure relates to a silicon carbide epitaxial substrate and a method for manufacturing a silicon carbide epitaxial substrate.

Silicon carbide (SiC) semiconductors have higher breakdown electric field strength, electron saturation drift velocity, and thermal conductivity than silicon semiconductors. Therefore, silicon carbide semiconductors can realize power semiconductor devices that can operate at higher temperatures, higher speeds, and higher currents than conventional silicon devices. Silicon carbide is attracting attention as a semiconductor that realizes switching devices for driving motors used in electric vehicles and hybrid cars with high efficiency.

Silicon carbide semiconductors have multiple polytypes with different arrangements of carbon and silicon atoms in the stacking direction (<0001> direction), even if they have the same chemical composition. Furthermore, different polytypes are likely to be generated in a single crystal since the internal energy difference between the polytypes is small. Such different polytypes may form dislocations and stacking faults (SFs). In general, a silicon carbide substrate contains more such dislocations and stacking faults than a silicon substrate. Therefore, a silicon carbide epitaxial layer having few defects is grown on the silicon carbide substrate to manufacture a semiconductor device such as a switching element. The main structure of the semiconductor device is formed in the silicon carbide epitaxial layer.

However, dislocations and stacking faults that occur near the surface of the silicon carbide substrate propagate to the silicon carbide epitaxial layer during epitaxial growth. The defects deteriorate the crystal quality of the silicon carbide epitaxial layer. Therefore, the technique to improve the crystal quality of the silicon carbide substrate for forming high-quality silicon carbide epitaxial layers thereon is required for the widespread use of silicon carbide semiconductor devices.

Stacking faults are two-dimensional planar defects and are typical defects in the silicon carbide epitaxial layers. Such stacking faults occur in the silicon carbide epitaxial layer, grown on the silicon carbide semiconductor substrate that includes basal plane dislocations (BPD), in bipolar operation under forward-biased voltage. The basal plane dislocations in the silicon carbide substrate expand into the epitaxial layer. Stacking faults, which have high electrical resistance, increase the internal electrical resistance of the SiC-based power device, which can result in increased heat generation due to power loss and device destruction. Such phenomenon in the silicon carbide device is known as bipolar degradation (Non-Patent Document 1). Therefore, from the viewpoint of the long-term reliability of electronic power devices, it is necessary to restrain the expansion of basal plane dislocations in the silicon carbide epitaxial layer and the occurrence of stacking faults that form a high resistance layer.

Line-shaped surface defects appear on the surface of the silicon carbide epitaxial layer. The line-shaped surface defects can be accompanied by stacking faults, and it is preferable to restrain generations of line-shaped surface defects in the epitaxial growth layer.

CITATION LIST

Patent Literature

[Patent Document 1] Japan Patent No. 6295969
[Patent Document 2] Japan Patent No. 4539140

Non-Patent Literature

[Non-Patent Document 1] Noboru Otani, "Status of development of low resistivity SiC single crystals for power device applications", Journal of Japan Crystal Growth Society, Vol. 45, No. 3 (2018) 45-3-01
[Non-Patent Document 2] Yuki Ishida, "Recent Developments in the High-Rate Growth of SiC Epitaxial Layers by the Chemical Vapor Deposition Method", J. Vac. Soc. Jpn., Vol. 54, No. 6, 2011
[Non-Patent Document 3] Shunichi Nakamura, 2 others, "Homoepitaxial Growth on 4H-SiC {0001}-Vicinal Faces, J. Soc. Mat. Sci., Japan, Vol. 53, No. 12, pp. 1323-1327, December 2004

SUMMARY

The present disclosure provides a silicon carbide epitaxial substrate comprising a silicon carbide epitaxial layer having few defects and a method for manufacturing the same.

A silicon carbide epitaxial substrate according to one embodiment of the present disclosure includes: a silicon carbide substrate having a first surface; and a silicon carbide epitaxial layer located on the first surface of the silicon carbide substrate, wherein the first surface is a (000-1) C-face, and a line-shaped surface defect density on a top surface of the silicon carbide epitaxial layer is less than 1.0 $cm^{-2}$ and a stacking fault density is less than 1.2 $cm^{-2}$.

In one embodiment, the line-shaped surface defect density is less than 0.5 $cm^{-2}$.

In one embodiment, the line-shaped surface defect density is less than 0.35 $cm^{-2}$.

In one embodiment, the stacking fault density is less than 1.0 $cm^{-2}$.

In one embodiment, the stacking fault density is less than 0.35 $cm^{-2}$.

In one embodiment, a basal plane dislocation density on the first surface of the silicon carbide substrate is less than 3000 $cm^{-2}$.

In one embodiment, a basal plane dislocation density on the first surface of the silicon carbide substrate is less than 2000 $cm^{-2}$.

In one embodiment, a ratio of the line-shaped surface defect density to the basal dislocation density on the first surface of the silicon carbide substrate is less than 0.04%.

In one embodiment, a ratio of the stacking fault density to the basal dislocation density on the first surface of the silicon carbide substrate is less than 0.05%.

In one embodiment, the first surface has an off angle of 4° or less.

In one embodiment, a surface roughness Ra of the first surface is 1 nm or less.

A method for manufacturing a silicon carbide epitaxial substrate according to one embodiment of the present disclosure includes: providing a silicon carbide substrate having a first surface, the first surface being a (000-1) C-face; and growing a silicon carbide epitaxial layer on the first surface of the silicon carbide substrate in a growth chamber by introducing a gas containing carbon and silicon into the growth chamber at a ratio of C/Si ratio of 1 or more and 1.6 or less.

In one embodiment, a basal plane dislocation density on the first surface of the silicon carbide substrate is less than 3000 $cm^{-2}$.

In one embodiment, a basal plane dislocation density on the first surface of the silicon carbide substrate is less than 2000 $cm^{-2}$.

In one embodiment, the first surface of the silicon carbide substrate has an off angle of 4° or less.

In one embodiment, a surface roughness Ra of the first surface of the silicon carbide substrate is 1 nm or less.

DETAILED DESCRIPTION

A Structure of Silicon Carbide Epitaxial Substrate

Figure 1:
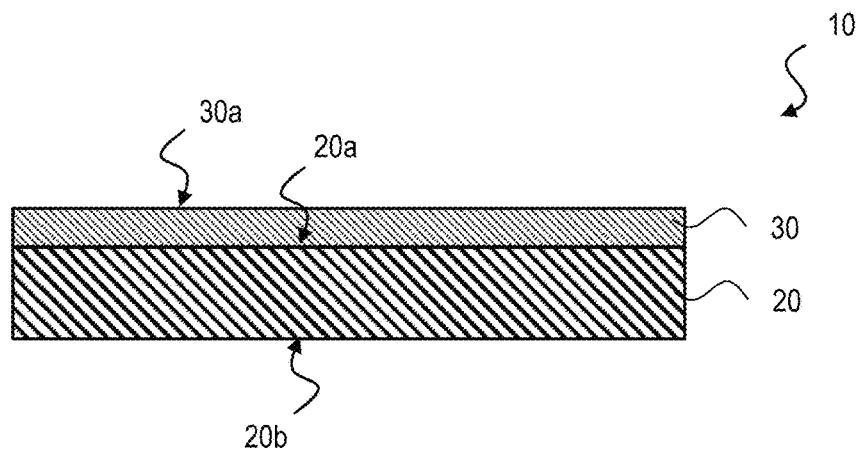
FIG. 1 is a schematic cross-sectional view of the silicon carbide epitaxial substrate of the present embodiment.

FIG. 1 illustrates a schematic cross-sectional view of a silicon carbide epitaxial substrate 10 in a certain embodiment of the present invention. The silicon carbide epitaxial substrate 10 has a silicon carbide substrate 20 and a silicon carbide epitaxial layer 30 on the silicon carbide substrate 20.

The silicon carbide substrate 20 has a first surface 20a and a second surface 20b located on the opposite side of the first surface 20a. The silicon carbide epitaxial layer 30 is disposed on the first surface 20a. The silicon carbide substrate 20 is made of single-crystalline silicon carbide. The polytype of the silicon carbide substrate 20 is preferably "4H". The size of the silicon carbide substrate 20 is not limited. However, from the viewpoint of mass production of semiconductor devices manufactured by using the silicon carbide epitaxial substrate 10, a diameter of the silicon carbide substrate 20 is preferably 100 mm or more, and more preferably 150 mm or more. The silicon carbide substrate 20 may have a thickness based on the wafer diameter according to the SEMI standard for SiC. For example, when the wafer diameter is 100 nm or 150 nm, the thickness of silicon carbide substrate 20 is 350 μm±25 μm or 500 μm±25 μm.

Figure 2:
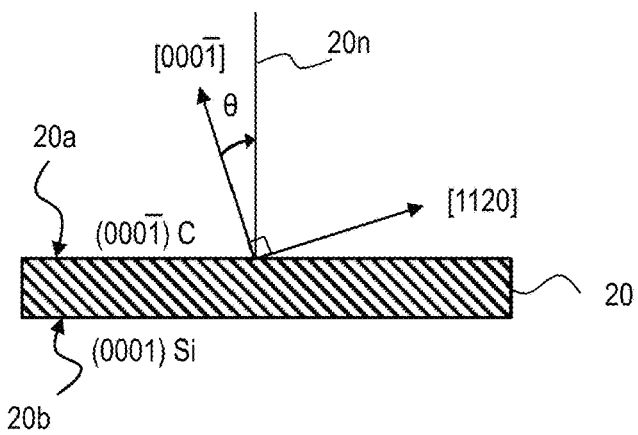
FIG. 2 is a schematic diagram showing the crystal orientation of the silicon carbide substrate used in the silicon carbide epitaxial substrate of the present embodiment.

FIG. 2 is a schematic view showing the crystal orientation of a silicon carbide substrate used in the present embodiment. The first surface 20a of the silicon carbide substrate 20 has a lattice plane defined by (000-1) C under the Hexagonal Miller-Bravais notation.

Here, "C" means carbon. The top face of the first surface 20a is a carbon-terminated face with carbon atoms exposed. To simplify the description in the present disclosure, the top face of the first surface 20a is referred to as (000-1) C-face. On the other hand, the top face of the second surface 20b is a silicon-terminated face with silicon atoms exposed, and the second surface 20b is referred to as a (0001) Si-face.

A silicon carbide substrate has carbon and silicon faces. Conventionally, the silicon carbide epitaxial layer is grown on the silicon face of the silicon carbide substrate. It is easier to control the epitaxial growth of a silicon carbide epitaxial layer on the silicon face, and it is also easier to control doping of the impurities into the epitaxial layer grown on the silicon face. Therefore, in the patent and non-patent literature, if there is no mention of whether the top face of the silicon carbide substrate is the carbon or silicon face, it is assumed that the silicon face of the silicon carbide substrate is used for the epitaxial growth.

The inventors studied the technology to restrain line-shaped surface defects and stacking faults which are typical defects in silicon carbide semiconductors.

The inventors found that epitaxial growth of silicon carbide epitaxial layers on carbon-terminated faces of the silicon carbide substrate can restrain line-shaped surface defects and stacking faults, as explained below.

The silicon carbide substrate 20 is preferably an off-axis substrate. FIG. 2 is a schematic view showing the cross-section of the silicon carbide substrate 20. The silicon carbide substrate 20 is preferably an off-axis substrate having an off-angle θ. Specifically, it is preferable that the first surface 20a, or normal line 20n of the first surface 20a, is titled θ from the [000-1] direction toward the [0034] direction. The off-angle θ is preferably from 0.5° to 8°, and more preferably from 0.5° to 5°.

The characteristics of the first surface 20a of the silicon carbide substrate 20 are described in detail. The first surface 20a is preferably chemical mechanical polished. Specifically, the first surface 20a is preferably chemical mechanical polished until the surface roughness Ra is 1 nm or less. More preferably, Ra of the first surface 20a is 0.2 nm or less. Ra can be measured, for example, by white light interference microscopy. For example, Ra is a value obtained by measuring the first surface 20a at three locations with a length of 100 μm and obtaining the average. Although Ra can be ideally 0 nm, Ra never realistically be 0 nm. Therefore, the lower limit of Ra is preferably larger than 0.

Also, a BPD density on the first surface 20a is preferably 3000 defects per cm$^2$ or less (3000 cm$^{-2}$ or less), more preferably 2000 cm$^2$ or less, and even more 1000 cm$^2$ or less. The BPD density can be measured, for example, by etching the first surface 20a by molten KOH and measuring the number of BPDs that appear as etch pits by optical microscopy. As well as Ra, the lower limit of the range of BPD density is preferably larger than 0.

The silicon carbide epitaxial layer 30 is formed by epitaxial growth on the first surface 20a of the silicon carbide substrate 20. The thickness of the silicon carbide epitaxial layer 30 can be changed according to the required performance of a semiconductor device which is manufactured by using the silicon carbide epitaxial substrate 10. For example, the thickness of the silicon carbide epitaxial layer 30 is about from 1 μm or more to 100 μm or less.

A line-shaped surface defect density of the top of surface 30a of the silicon carbide epitaxial layer 30 is preferably less than 1.0 cm$^{-2}$. The line-shaped surface defect density is preferably less than 0.5 cm$^{-2}$, more preferably less than 0.35 cm$^{-2}$, and even more preferably less than 0.1 cm$^{-2}$. A stacking fault density of the top of face 30a of the silicon carbide epitaxial layer 30 is preferably less than 1.2 cm$^{-2}$. The stacking faults density is preferably less than 1.0 cm$^{-2}$, more preferably less than 0.35 cm$^{-2}$, and even more preferably less than 0.1 cm$^{-2}$. As well as Ra, the lower limit of the range of the line-shaped surface defect density and the stacking fault density is preferably larger than 0.

In the present embodiment, the line-shaped surface defects have an elongated line-shape as viewed from the normal direction of the top face 30a of the silicon carbide epitaxial layer 30. The longitudinal direction (extending direction) of the line-shaped surface defects may coincide with the step-flow direction (off-angle direction), may be inclined ±5° to 60° to the step-flow direction, or may extend in two directions in a V-shape to the step-flow direction. In this embodiment, line-shaped surface defects originate from defects or scratches on the first surface 20a of the silicon carbide substrate 20. Therefore, the longitudinal length of the line-shaped surface defect, L depends on the thickness d of the silicon carbide epitaxial layer 30 and off-angle θ of the silicon carbide 20, and the following relationship: L=d/tan θ. Line-shape surface defects are also called carrot defects.

The line-shaped surface defect density can be measured, for example, by a wafer inspection instrument that can acquire differential interference optical microscopy images. Such a wafer inspection instrument can obtain the position and number of regions of brightness changes that appear as a line-shaped pattern in the acquired differential interference optical microscopy image, which allows counting the line-shaped surface defect density.

The stacking faults are plane defects, which are originating from defects or scratches on the first surface 20a of the silicon carbide substrate 20 or from defects inside the silicon carbide epitaxial layer 30. Such stacking faults extend or expand in a triangular shape toward the top face 30a of the silicon carbide epitaxial layer 30. Most of the stacking faults are contained in the silicon carbide epitaxial layer 30. The stacking fault density can be measured, for example, by a wafer inspection instrument that has a 355 nm excitation light source and near-UV filter and can acquire photoluminescence (PL) images. Such a wafer inspection instrument can calculate the stacking fault density by obtaining the position and number of regions of triangle-shaped brightness change from the acquired PL image.

A Method for Manufacturing the Silicon Carbide Epitaxial Substrate

A method of manufacturing the silicon carbide epitaxial substrate 10 in this embodiment is described below. First, the silicon carbide substrate 20 is prepared. The silicon carbide substrate 20 has a first surface 20a with the face orientation and off-angle described above. The surface roughness Ra of the first surface 20a is adjusted to 1 nm or less by chemical mechanical polishing (CMP). It is preferable that the value of the surface roughness Ra is small. Therefore, for example, commercially available silicon carbide substrates may be obtained and the first surface 20a can be formed by CMP. For example, the first surface 20a can be chemical mechanical polished by using the method described in Japan Patent No. 6295969. Furthermore, in addition to the step of applying CMP, the step of wet etching the first surface 20a and the step of oxidizing the first surface 20a by gas can be performed, and these three steps can be performed two or more times in combination as appropriate.

Next, the silicon carbide epitaxial layer 30 is grown. Any growth method can be used as long as the equipment is capable of epitaxially growing the silicon carbide epitaxial layer 30. From the viewpoint that the silicon carbide epitaxial layer 30 that have even characteristic can be grown on the silicon carbide substrate 20, the silicon carbide epitaxial layer 30 is preferably grown by using a CVD system using chemical vapor deposition.

For example, the silicon carbide substrate 20 is introduced into the growth chamber or reactor in the CVD system and placed on the holder with the first surface 20a, which is the (000-1) face up. The silicon carbide substrate 20 is heated to a temperature of between 1500° C. and 1800° C., and carrier gas, carbon source gas and silicon source gas, and dopant gas are introduced into the growth chamber to grow the silicon carbide epitaxial layer 30. For example, hydrogen ($H_2$) and other gases can be used as the carrier gas. Propane ($C_3H_8$) and other gases can be used as the carbon source gas in the raw material gas. Also, silane ($SiH_4$) and other gases can be used as the silicon source gas in the raw material gas. Nitrogen ($N_2$) and other gases can be used as dopants. Before growing the silicon carbide epitaxial layer 30, the only carrier gas is introduced into the growth chamber, and the first surface 20a of the silicon carbide substrate 20 can be cleaned.

The rate of carbon in the carbon source gas to silicon in the silicon source gas to be introduced, C/Si, is preferably 1 or more. Specifically, C/Si is preferably from 1 to 1.6. As described below, when C/Si exceeds 1.6, the line-shaped surface defect density on the first surface 20a of the growing silicon carbide epitaxial layer 30 increases. Also, as described in the non-patent literature "Recent Developments in the High-Rate Growth of SiC Epitaxial Layers by the Chemical Vapor Deposition Method (J.Vac.Soc.Jpn., Vol. 54, No. 6, 2011)", when C/Si is less than 1 and silane ($SiH_4$) is supplied in excess, Si droplets with Si agglomerated on the surface of the epitaxial layer are generated during the epitaxial growth process. This is not preferable because of the defects caused by Si droplets.

It is preferable that pressure while the silicon carbide epitaxial 30 is growing in growth the chamber is from 10 kPa to 50 kPa.

As explained in detail in the following example, according to the manufacturing method for the silicon carbide epitaxial substrate 10 of this embodiment, by growing the silicon carbide epitaxial layer 30 on the (000-1) C-face of the silicon carbide substrate 20, it is possible to restrain the formation of line-shaped surface defects and stacking faults in the silicon carbide epitaxial layer 30, starting from line-shaped surface defects, stacking defects, or scratches on the first surface 20a of the silicon carbide substrate 20. In particular, stacking faults can be reduced. In addition, in particular, line-shaped surface defect density can be reduced by setting the C/Si in the raw material gas to between 1 and 1.6 when the silicon carbide epitaxial layer 30. The C/Si is preferably 1.5 or less, more preferably 1.4 or less, and even more preferably 1.3 or less. In addition, by chemical mechanical polishing to reduce the surface roughness of the first surface 20a that is a (000-1) C-face, Ra to be 1 nm or less, the propagation of the line-shaped surface defects and the stacking faults from the silicon carbide substrate 20 to the silicon carbide epitaxial layer 30 can be restrained.

EXAMPLES

<Preparation of Sample>

The following describes the results of preparing a silicon carbide epitaxial substrate 10 using the method for manufacturing the silicon carbide epitaxial substrate in this embodiment and measuring the line-shaped surface defect density and the stacking defect density.

Embodiments 1 to 6

A silicon carbide substrate 20 with a diameter of 150 mm was prepared. The silicon carbide substrate 20 has a first surface 20a which is a (000-1) C-face and off-angle θ which is 4°. The first surface 20a was chemical mechanical polished until the surface roughness, Ra is 1 nm or less. Chemical mechanical polishing was performed by using slurry and polishing pad with colloidal silica as the main component and oxidant added. After that, a silicon carbide epitaxial layer 30 was grown on the first surface 20a of the silicon carbide 20. The growth temperature was set at 1600° C., the growth rate at 40 μm/h, and the pressure in the growth chamber at 30 kPa. As shown in Table 1, the C/Si in the raw material gas was set to 1.25 or 1.4. Hydrogen was used as the carrier gas, and propane and silane were used as the feed gas. Also, nitrogen was used as a dopant source. Examples 1 to 6 were manufactured by using the silicon carbide substrate 20, respectively.

Reference Examples 1 to 3

A silicon carbide epitaxial substrates of reference example 1 were manufactured on the condition that the C/Si ratio in the raw material gas was set to 1.7, and the other conditions were the same as in Examples 1 to 6.

A silicon carbide substrate with surface roughness, Ra of about 10 nm was prepared without applying CMP on the first surface, and the other conditions were the same as in examples 3-5 to manufacture a silicon carbide epitaxial substrate of reference example 2.

A silicon carbide substrate whose first surface is a (0001) Si-face was prepared, and the other conditions were the same as in examples 3-5 to manufacture a silicon carbide epitaxial substrate of reference example 3.

Reference examples 1 and 2 were manufactured by using one silicon carbide substrate respectively, and reference example 3 was manufactured by using 33 silicon carbide substrates of various grades.

Measurement

A basal plane dislocation density of the first surface of the silicon carbide substrate was based on the values disclosed by the substrate manufacturer. The line-shaped surface defect density on the top face of the silicon carbide epitaxial layer of the manufactured silicon carbide epitaxial substrate was measured. The measuring instrument and measurement conditions used for the measurement are as follows. The measurements were performed excluding the area from the periphery of the substrate to 3 mm inside.

Measuring instrument name: SICA88 manufactured by Lasertec Corporation

Measurement condition: Optical inspection using 532 nm light source wavelength

Figure 7:
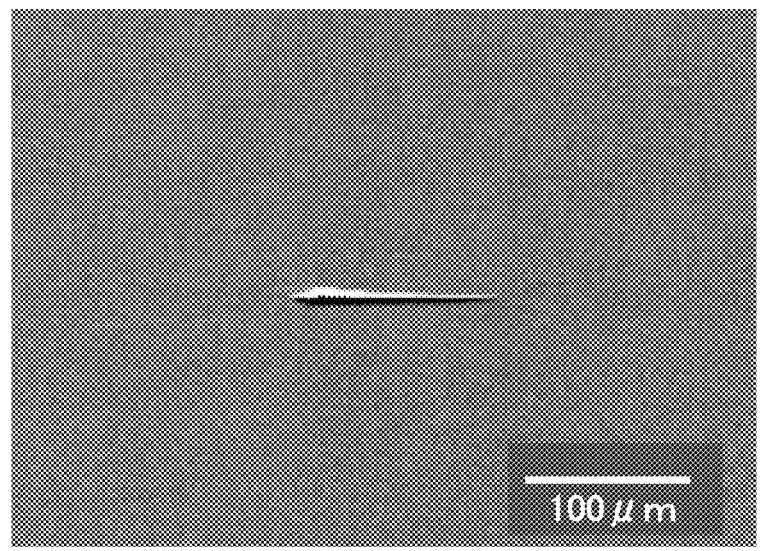
FIG. 7 shows an example of a differential interference contrast optical microscopic image of linear surface defects observed in the silicon carbide epitaxial substrates of Examples and Comparative Examples.

The acquired differential interference optical microscopy images were analyzed by using the image analysis software provided with the instrument. Since line-shaped surface defects are uneven against surfaces, their brightness appears differently on the image compared to a normal crystal part that is flat. FIG. 7 shows an example of a differential interference optical microscopy image of a line-shaped surface defect. The total number of line-shaped surface defects parallel to the step-flow direction, line-shaped surface defects extending at an angle to the step-flow growth direction, and V-shaped line-shaped surface defects extending in an open manner to the step-flow direction was defined as the number of line-shaped surface defects that generated.

The stacking defect density on the top face of the silicon carbide epitaxial layer of the manufactured silicon carbide epitaxial substrate was measured. The instrument and measurement conditions used for the measurement are as follows. The measurements were performed excluding the area from the periphery of the substrate to 3 mm inside.

Measuring instrument name: Candela CS920 manufactured by KLA TENCOR

Measurement conditions: Photoluminescence (PL) inspection using an excitation light wavelength of 355 nm. Near-UV and visible light filters were used as filters.

Figure 8:
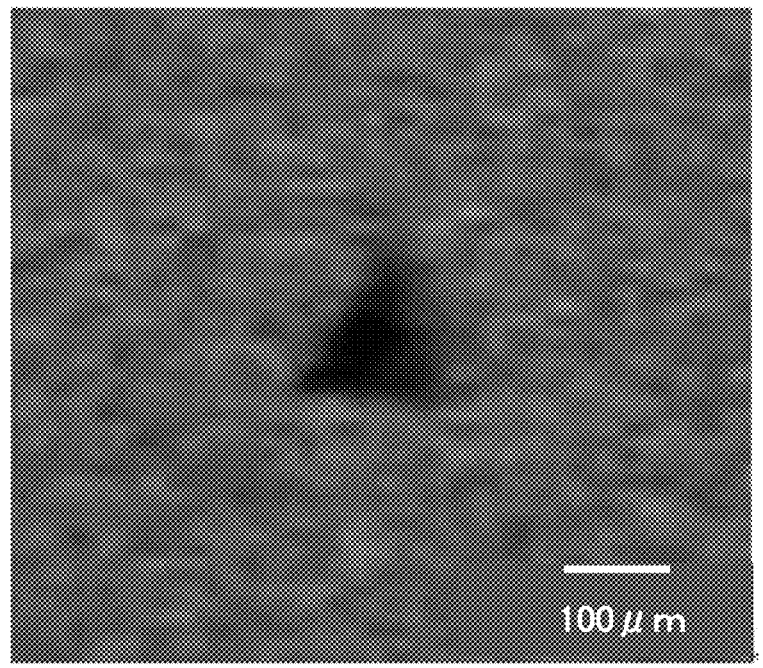
FIG. 8 shows an example of a PL image obtained by a near-ultraviolet filter of stacking faults observed in the silicon carbide epitaxial substrates of Examples and Comparative Examples.
Figure 9:
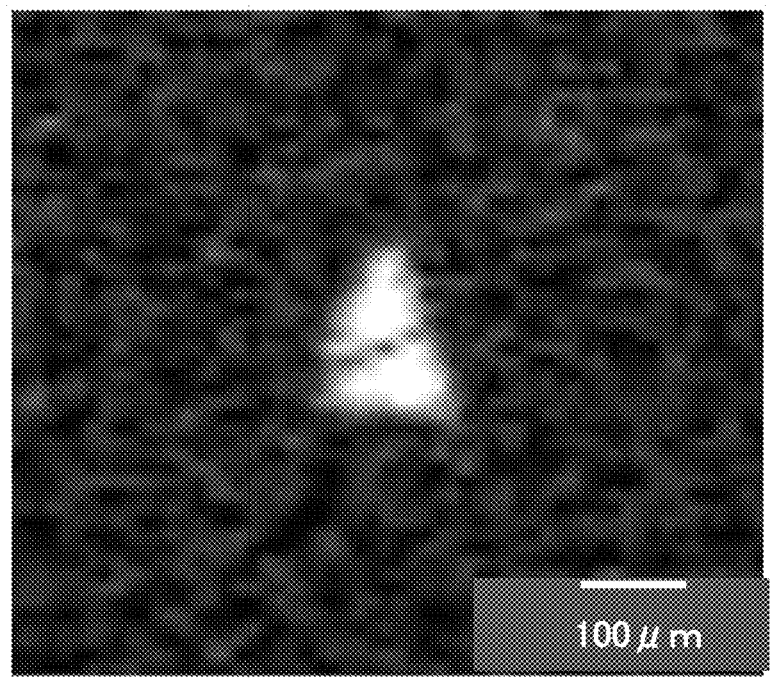
FIG. 9 shows an example of a PL image obtained by a visible light filter of stacking faults observed in the silicon carbide epitaxial substrates of Examples and Comparative Examples.

FIG. 8 shows a PL image of a stacking defect with a near-UV filter. FIG. 9 shows a PL image of a stacking defect with a visible light filter.

Results and Discussion

Figure 3:
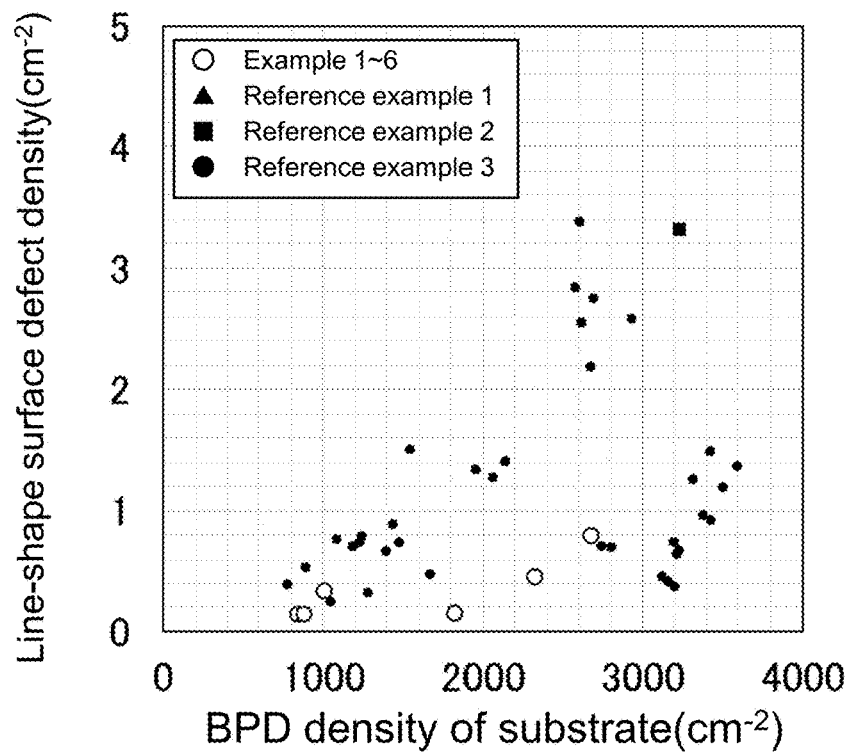
FIG. 3 is a graph showing the relationship between the basal dislocation density and the linear surface defect density in the substrates of Examples and Comparative Examples.
Figure 4:
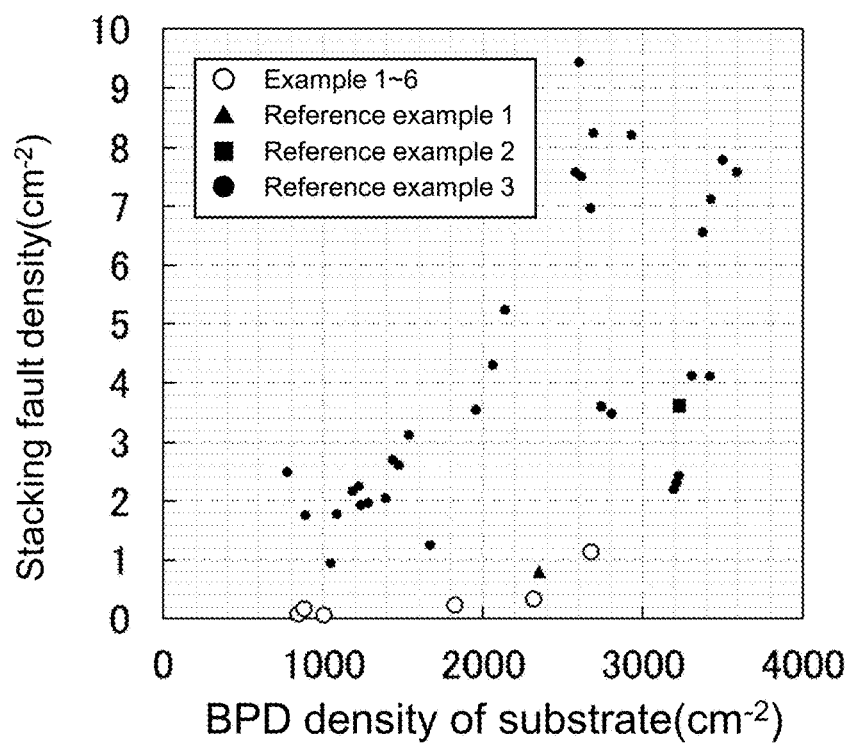
FIG. 4 is a graph showing the relationship between the basal dislocation density and the stacking defect density in the substrates of Examples and Comparative Examples.
Figure 5:
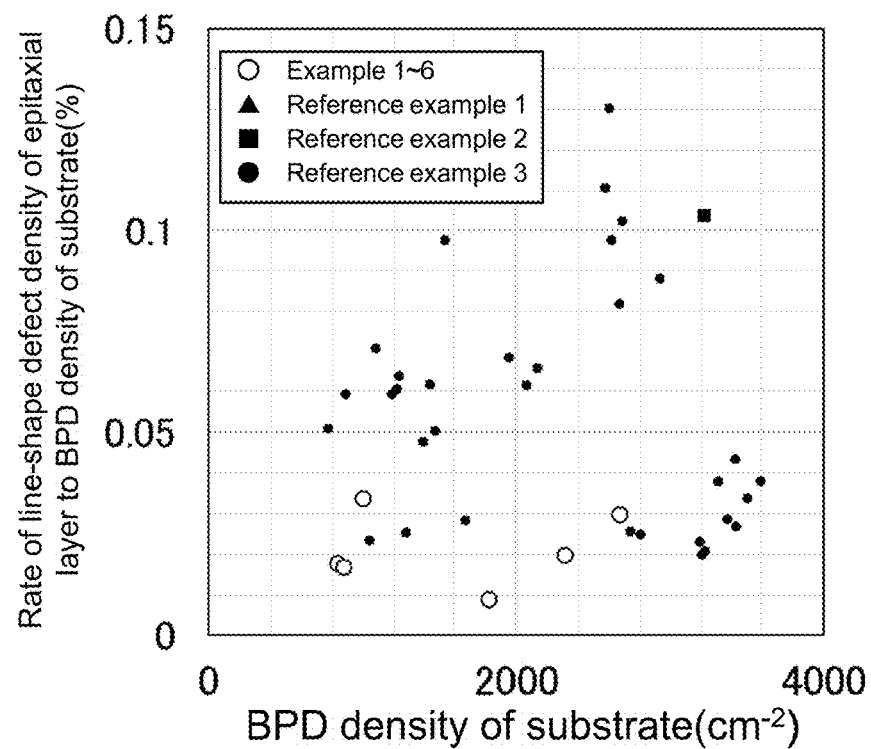
FIG. 5 is a graph showing the relationship between the basal dislocation density in the substrates of Examples and Comparative Examples and the ratio of the linear surface defect density to the basal dislocation density in the substrate.
Figure 6:
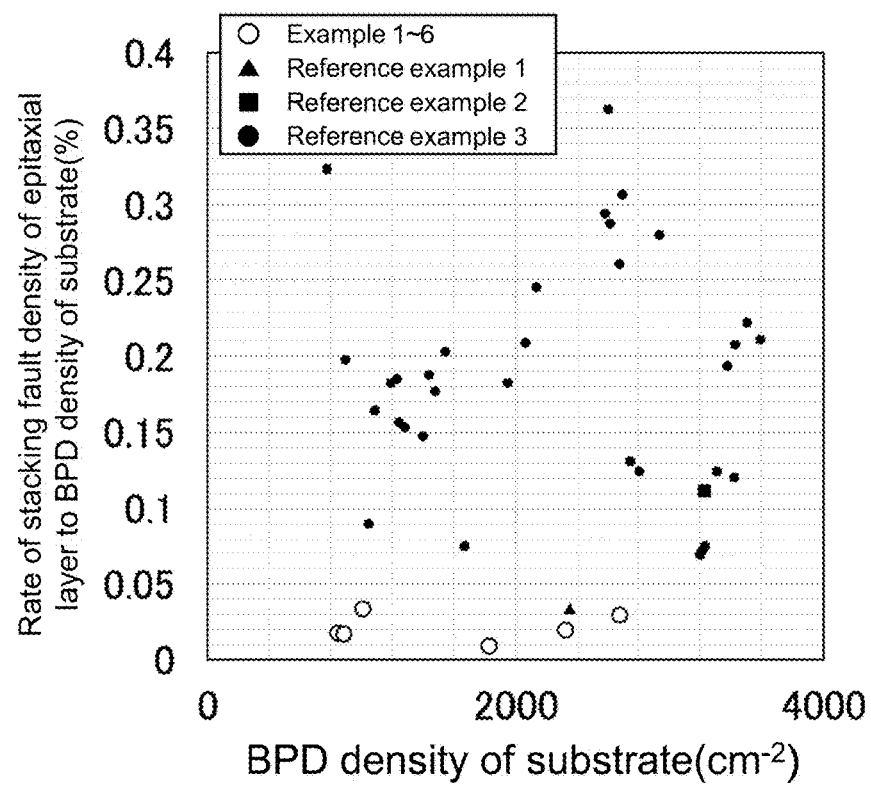
FIG. 6 is a graph showing the relationship between the basal dislocation density in the substrates of Examples and Comparative Examples and the ratio of the stacking fault density to the basal dislocation density in the substrate.

Here, a basal plane dislocation density on the first surface of the silicon carbide substrate was used as an indicator of the crystal quality grade of the silicon carbide substrate. Table 1 shows the basal dislocation density on the first surface of the silicon carbide substrates of examples 1-6 and reference examples 1-3, as well as the line-shaped surface defect density and stacking defect density on the top face of the silicon carbide epitaxial layer. A relationship between the basal dislocation density and the line-shaped surface defect density of these samples is shown in FIG. 3. FIG. 4 shows a relationship between the basal plane dislocation density and the stacking fault density for these samples. FIG. 5 shows a relationship between the basal plane dislocation density and a ratio of the line-shaped surface defect density to the basal plane dislocation density for these samples. FIG. 6 shows a relationship between the basal plane dislocation density and a ratio of the stacking fault density to the basal plane dislocation density for these samples.

TABLE 1

|  |  | Example 1 | Example 2 | Example 3 | Example 4 | Example 5 | Example 6 | Reference example 1 | Reference example 2 | Reference example 3 |
|---|---|---|---|---|---|---|---|---|---|---|
| The first surface |  | C-face | C-face | C-face | C-face | C-face | C-face | C-face | C-face | Si-face |
| Temperature | °C. | 1600 | 1600 | 1600 | 1600 | 1600 | 1600 | 1600 | 1600 | 1600 |
| C/Si |  | 1.25 | 1.4 | 1.25 | 1.25 | 1.25 | 1.4 | 1.7 | 1.25 | 1.25 |
| Preasure | kPa | 30 | 30 | 30 | 30 | 30 | 30 | 30 | 30 | 30 |
| Off-angle | deg. | 4 | 4 | 4 | 4 | 4 | 4 | 4 | 4 | 4 |
| Diameter of substrate | mm | 150 | 150 | 150 | 150 | 150 | 150 | 150 | 150 | 150 |
| With or without CMP to the first surface | with/ without | with | with | with | with | with | with | with | without | with |
| BPD density of substrate | $cm^{-2}$ | 1822 | 2671 | 1000 | 837 | 2316 | 876 | 2353 | 3225 | 774-3593 |
| Line-shape surface defect density of epitaxial layer | $cm^{-2}$ | 0.16 | 0.8 | 0.34 | 0.15 | 0.46 | 0.15 | 12.61 | 3.33 | 0.25-3.39 |
| Stacking fault density of epitaxial layer | $cm^{-2}$ | 0.24 | 1.14 | 0.08 | 0.09 | 0.34 | 0.18 | 0.80 | 3.62 | 0.94-9.44 |
| Ratio of line-shape defect density of epitaxial layer to BPD density of | % | 0.010 | 0.030 | 0.030 | 0.020 | 0.020 | 0.020 | 0.540 | 0.10 | 0.02-0.13 |
| Ratio of stacking fault density of epitaxial layer to BPD density of substrate | % | 0.010 | 0.040 | 0.010 | 0.010 | 0.020 | 0.020 | 0.030 | 0.11 | 0.07-0.36 |

From the comparison between examples 1-6, reference example 1, and reference example 3, it is shown that the stacking fault density and the line-shaped surface defect density on the top face of the silicon carbide epitaxial layer formed on the (000-1) C-face are much smaller than those on the top face of the silicon carbide epitaxial layer formed on the (0001) Si surface. In particular, the stacking faults density was restrained to less than 1.2 $cm^{-2}$ in examples 1-6. Also, the propagation of basal plane dislocations on the first surface of the silicon carbide substrate to the silicon carbide epitaxial layer and the formation of stacking faults in the silicon carbide epitaxial layer was effectively restrained. In examples 1, 4, and 6, the line-shaped defect density is kept 0.16 $cm^{-2}$ or less. In addition, in examples 1, 3, 4, and 6, the stacking fault density is 0.24 $cm^{-2}$ or less. According to the inventor's study, a method described in patent Japan Patent No. 6295969 by applying CMP, polishing technique with oxidation and etching, and using a silicon carbide substrate with a basal plane dislocation density of 500 $cm^{-2}$ or less, the line-shaped defect density can be reduced to less than 0.1 $cm^{-2}$. FIG. 6 shows that this defect restrains effect is generally constant regardless of the basal plane dislocation density on the first surface of the silicon carbide substrate. Specifically, at least in the range where the basal plane dislocation density on the first surface of the silicon carbide substrate is 3000 $cm^{-2}$ or less, a ratio of the stacking defect density to the basal plane dislocation density on the first surface of the silicon carbide substrate is less than 0.05%.

Also, from the comparison between examples 1-6 and reference example 1, it was found that the line-shaped surface defect density was reduced to 1.0 $cm^{-2}$ by setting the C/Si in the raw material gas within the range of 1.0 to 1.6. On the other hand, when the C/Si in the raw material gas is larger than 1.6, the line-shaped surface defect density on the top face of the grown silicon carbide epitaxial layer is significantly larger. The line-shaped surface defect density of the sample in reference to example 1 is not shown in FIG. 3 because it is greater than 12.

FIG. 5 shows that when the basal dislocation density on the first surface of silicon carbide substrate is less than 3000 $cm^{-2}$, the ratio of line-shaped surface defect density to basal dislocation density on the first surface of silicon carbide substrate is less than 0.04%.

In other words, these results show that the effect of the basal plane dislocations on the silicon carbide substrates can be effectively restrained by growing the silicon carbide epitaxial layer on the (000-1) C-face and keeping the C/Si ratio in the raw material gas between 1 and 1.6. It is possible to reduce the line-shaped surface defects and stacking faults on the top face of the silicon carbide epitaxial layer.

Furthermore, from the comparison between examples 1-6 and reference example 2, it is shown that it is important to smooth the first surface of the silicon carbide substrate by CMP or to remove the processing work-affected layer by CMP in order to reduce line-shaped surface defects and stacking faults on the top face of the silicon carbide epitaxial layer.

Japan Patent No. 4539140 discloses that it is possible to epitaxially grow silicon carbide semiconductor layers on the silicon carbide substrate with a low off-angle of less than 1° by using the (000-1) C-face of the silicon carbide substrate to grow silicon carbide epitaxial layers. Generation of step-bunching can be restrained by using the substrate with a low-angle offset. However, according to this patent document, the surface defect density of the silicon carbide epitaxial layer is 100 $cm^{-2}$, which is considerably larger than the line-shaped surface defect density and the stacking fault density in the samples of Examples 1 to 6 and reference examples 1 to 3 described above.

For example, the non-patent document "Homoepitaxial Growth on 4H-SiC {0001}-Vicinal Faces (J. Soc. Mat. Sci. Japan), Vol. 53, No. 12, pp. 13 23-1327, December 2004." refers to a nearby (000-1) C-face defect in homoepitaxially grown layers. This non-patent document discloses that the surface defect density was reduced by applying thermal oxide layer formation before epitaxial growth, but the document does not show specific values for the density. The surface defect density estimated from FIG. 4 of "Surface observation image of homoepitaxially grown layer on a surface nearby (000-1) C-face" is about 100 cm$^{-2}$ (the number of surface defects is 6 in 6 mm$^2$)

In the silicon carbide epitaxial substrate manufactured by the method of this embodiment of the present disclosure, the line-shaped surface defect density and the stacking fault density on the top face of the silicon carbide epitaxial layer are considerably smaller than before, and a silicon carbide epitaxial substrate with a high-quality silicon carbide epitaxial layer can be realized.

The silicon carbide epitaxial substrate of the present disclosure is a high-quality silicon carbide epitaxial substrate that can be used for various applications and is particularly suitable for the manufacture of semiconductor devices such as power devices.

What is claimed is:

1. A silicon carbide epitaxial substrate comprising:
a silicon carbide substrate having a first surface, a diameter of the silicon carbide substrate being 100 mm or more; and
a silicon carbide epitaxial layer located on the first surface of the silicon carbide substrate, wherein
the first surface is a (000-1)C-face having an off angle of 4° to 8°, and
a line-shaped surface defect density on a top surface of the silicon carbide epitaxial layer is less than 1.0 cm$^{-2}$ and a stacking fault density on the top surface of the silicon carbide epitaxial layer is less than 1.2 cm$^{-2}$.

2. The silicon carbide epitaxial substrate of claim 1, wherein the line-shaped surface defect density is less than 0.5 cm$^{-2}$.

3. The silicon carbide epitaxial substrate of claim 1, wherein the line-shaped surface defect density is less than 0.35 cm$^{-2}$.

4. The silicon carbide epitaxial substrate of claim 1, wherein the stacking fault density is less than 1.0 cm$^{-2}$.

5. The silicon carbide epitaxial substrate of claim 1, wherein the stacking fault density is less than 0.35 cm$^{-2}$.

6. The silicon carbide epitaxial substrate of claim 1, wherein a basal plane dislocation density on the first surface of the silicon carbide substrate is less than 3000 cm$^{-2}$.

7. The silicon carbide epitaxial substrate of claim 1, wherein a basal plane dislocation density on the first surface of the silicon carbide substrate is less than 2000 cm$^{-2}$.

8. The silicon carbide epitaxial substrate of claim 6, wherein a ratio of the line-shaped surface defect density on the top surface of the silicon carbide epitaxial layer to the basal dislocation density on the first surface of the silicon carbide substrate is less than 0.04%.

9. The silicon carbide epitaxial substrate of claim 6, wherein a ratio of the stacking fault density on the top surface of the silicon carbide epitaxial layer to the basal dislocation density on the first surface of the silicon carbide substrate is less than 0.05%.

10. The silicon carbide epitaxial substrate of claim 1, wherein a surface roughness Ra of the first surface is 1 nm or less.

11. The silicon carbide epitaxial substrate of claim 1, wherein the off angle is about 4°.

* * * * *